(12) United States Patent
He et al.

(10) Patent No.: US 11,378,613 B2
(45) Date of Patent: Jul. 5, 2022

(54) IGBT MODULE RELIABILITY EVALUATION METHOD AND DEVICE BASED ON BONDING WIRE DEGRADATION

(71) Applicant: WUHAN UNIVERSITY, Hubei (CN)

(72) Inventors: Yigang He, Hubei (CN); Lie Li, Hubei (CN); Liulu He, Hubei (CN); Chenyuan Wang, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 17/161,684

(22) Filed: Jan. 29, 2021

(65) Prior Publication Data
US 2022/0003807 A1 Jan. 6, 2022

(30) Foreign Application Priority Data
Jul. 3, 2020 (CN) .......................... 202010635550.6

(51) Int. Cl.
*G01R 31/26* (2020.01)
*H01L 29/739* (2006.01)
*G01R 31/27* (2006.01)

(52) U.S. Cl.
CPC ....... *G01R 31/2642* (2013.01); *G01R 31/261* (2013.01); *G01R 31/2608* (2013.01); *G01R 31/2614* (2013.01); *G01R 31/2621* (2013.01); *H01L 29/7393* (2013.01); *G01R 31/2601* (2013.01); *G01R 31/275* (2013.01)

(58) Field of Classification Search
CPC ............ G01R 31/2642; G01R 31/2608; G01R 31/2614; G01R 31/2621; G01R 31/261; G01R 31/2601; G01R 31/275; H01L 29/7393
USPC ...... 324/340, 361, 500, 537, 762.01, 762.08
See application file for complete search history.

(56) References Cited

U.S. PATENT DOCUMENTS

| | | | |
|---|---|---|---|
| 2018/0017613 A1* | 1/2018 | Qiao | G01R 31/2619 |
| 2021/0063466 A1* | 3/2021 | Zhang | G01R 31/70 |
| 2021/0318373 A1* | 10/2021 | He | G01R 31/2619 |

* cited by examiner

*Primary Examiner* — Raul J Rios Russo
(74) *Attorney, Agent, or Firm* — JCIPRNET

(57) ABSTRACT

The disclosure discloses an IGBT module reliability evaluation method and device based on bonding wire degradation, which belong to the field of IGBT reliability evaluation. The realization of the method includes: obtaining a relationship between a IGBT chip conduction voltage drop $U_{ces}$ and an operating current $I_c$ along with a chip junction temperature $T_c$; for an IGBT module under test, obtaining the conduction voltage drop $U_{ces-c}$ of the IGBT chip through the operating current $I_c$ and the chip junction temperature $T_c$; obtaining an external conduction voltage drop $U_{ces-m}$ of the IGBT module by using a voltmeter; performing subtraction to obtain a voltage drop at a junction of a IGBT chip and a bonding wire, and combining the operating current to obtain a resistance at the junction; determining that the IGBT module has failed when the resistance at the junction increases to 5% of an equivalent impedance of the IGBT module.

20 Claims, 3 Drawing Sheets

IGBT MODULE RELIABILITY EVALUATION METHOD AND DEVICE BASED ON BONDING WIRE DEGRADATION

CROSS-REFERENCE TO RELATED APPLICATION

This application claims the priority benefit of China application serial no. 202010635550.6, filed on Jul. 3, 2020. The entirety of the above-mentioned patent application is hereby incorporated by reference herein and made a part of this specification.

BACKGROUND

Technical Field

The disclosure belongs to the field of IGBT reliability evaluation, and more specifically, relates to a method and device for IGBT module reliability evaluation based on bonding wire degradation.

Description of Related Art

Insulate-Gate Bipolar Transistor (IGBT) power modules are commonly adopted semiconductor power conversion switching devices, and are the core devices for energy conversion and transmission for vehicles powered by new energy. Power modules are commonly adopted in renewable energy, traction, aerospace, electric vehicles and other fields. Monitoring the health of power modules is an important means to improve the safety and availability of IGBT devices. It is of great significance to find out how to accurately evaluate the reliability of IGBT for ensuring the safe operation of equipment, avoiding casualties and property losses caused by equipment failure, and promoting the sustainable development of society.

The possible causes for failure of IGBT include: (1) internal structural defects of the chip, which include impurities in silicon materials, chip defects, crystal defects, etc., as well as process defects (such as diffusion problems) that occur in the production process of the device; these defects can lead to failure of IGBT; (2) failure caused by various external stresses beyond the device's ability to withstand, such as electrical stress, thermal stress, mechanical stress, and electrostatic discharge; (3) latch failure, due to the parasitic thyristor PNPN structure inside the IGBT, when the collector current is large, the thyristor will be triggered to turn on, causing the gate to lose control of the device, and consequently the latch fails to perform function; (4) avalanche failure, there is avalanche breakdown inside microelectronic devices, IGBT is no exception, avalanche breakdown is classified into static avalanche breakdown and dynamic avalanche breakdown; and (5) failure in packaging.

Among the above five types of failure, packaging failures account for more than 50% of the total number of failures. Therefore, the research mainly focuses on packaging failures of IGBT modules and provides criterion for evaluating IGBT failure. The packaging failures of IGBT modules mainly include: (1) failure caused by aging of the solder layer; (2) failure caused by bonding wire's falling off. According to research, when the power is cycled, the probability of failure caused by bonding wire is significantly greater than the failure caused by the aging of the solder layer. Therefore, the reliability evaluation of IGBT module is conducted mainly based on bonding wire, so as to obtain more accurate information. However, since the bonding wire is located inside the module and is small in size, it is extremely difficult to directly evaluate parameters related to bonding wire, which adds difficulty to evaluation of reliability.

SUMMARY

In view of the above defects or improvement requirements of related art, the disclosure provides an Insulate-Gate Bipolar Transistor (IGBT) module reliability evaluation method and device based on bonding wire degradation, which can exhibit the failure characteristics of IGBT more accurately through an indirect method which measures the resistance of bonding wires to carry out reliability evaluation of IGBT module, so that IGBT reliability evaluation achieves a higher accuracy.

In order to achieve the above purpose, according to one aspect of the disclosure, an IGBT module reliability evaluation method based on bonding wire degradation is provided, including:

(1) The relationship between IGBT chip conduction voltage drop $U_{ces}$ and the operating current $I_e$ along with chip junction temperature $T_c$ is obtained.

(2) For the IGBT module under test, the chip conduction voltage drop $U_{ces\text{-}c}$ of the IGBT module under test is obtained through the operating current $I_c$ and the chip junction temperature $T_c$ based on the relationship between the IGBT chip conduction voltage drop $U_{ces}$ and the operating current $I_e$ along with the chip junction temperature $T_c$.

(3) The external conduction voltage drop $U_{ces\text{-}m}$ of the IGBT module under test is obtained.

(4) Subtraction is performed on the chip conduction voltage drop $U_{ces\text{-}c}$ and the external conduction voltage drop $U_{ces\text{-}m}$ of the IGBT module under test to obtain the voltage drop at the junction of the IGBT chip and the bonding wire, and the operating current is combined to obtain resistance at the junction.

(5) When the resistance at the junction increases to n % of the equivalent impedance of the IGBT module under test, it is determined that the IGBT module under test has failed.

Preferably, step (1) includes:

(1.1) A non-aging IGBT module with the same model as the IGBT under test is selected, the temperature at the position where the IGBT module is located is changed, the operating current is applied, and the voltage between the collector and emitter of the IGBT module is measured, thereby obtaining the chip conduction voltage drop $U_{ces}$ of the IGBT module under the corresponding condition.

(1.2) The data is recorded, a three-dimensional diagram of chip conduction voltage drop $U_{ces}$ of IGBT module—operating current $I_e$-chip junction temperature $T_c$ is illustrated, and the curve fitting method is adopted to obtain the function $U_{ces} = f(I_c, T_c)$ of $U_{ces}$ with respect to $I_c$ and $T_c$.

Preferably, step (2) includes:

(2.1) For the IGBT module under test, the chip junction temperature $T_c$ of the IGBT module under test is obtained when the IGBT module is a working state, and the operating current $I_c$ flowing through the IGBT module under test is obtained as well.

(2.2) Based on the function of $U_{ces}$ with respect to $I_c$ and $T_c$, the chip conduction voltage $U_{ces\text{-}c}$ of the IGBT module under test in the working process is obtained through calculation.

Preferably, step (4) includes:

The external conduction voltage drop $U_{ces\text{-}m}$ of the IGBT module under test is obtained, along with the chip conduction voltage drop $U_{ces\text{-}c}$ of the IGBT module under test obtained through calculation, the resistance $R_w$ at the junction of the chip and the bonding wire is obtained through the formula $U_{ces-m}=U_{ces-c}+I_w$.

Preferably, step (5) includes:

When the resistance at the junction increases to 5% of the equivalent impedance of the IGBT module under test, it is determined that the IGBT module under test has failed.

According to another aspect of the disclosure, an IGBT module reliability evaluation device based on bonding wire degradation is provided, which includes:

A relational expression obtaining module is configured to obtain the relationship between the IGBT chip conduction voltage drop $U_{ces}$ and the operating current $I_e$ along with the chip junction temperature $T_c$.

A chip conduction voltage drop obtaining module is configured to, for the IGBT module under test, obtain the chip conduction voltage drop $U_{ces-c}$ of the IGBT module under test through the operating current $I_c$ and the chip junction temperature $T_c$ based on the relationship between the IGBT chip conduction voltage drop $U_{ces}$ and the operating current $I_c$ along with the chip junction temperature $T_c$.

An external conduction voltage drop obtaining module is configured to obtain the external conduction voltage drop $U_{ces-m}$ of the IGBT module under test.

A resistance obtaining module is configured to perform subtraction on the chip conduction voltage drop $U_{ces-c}$ and the external conduction voltage drop $U_{ces-m}$ of the IGBT module under test to obtain the voltage drop at the junction of the IGBT chip and the bonding wire, and the operating current is combined to obtain resistance at the junction.

A failure determining module is configured to determine that the IGBT module under test has failed when the resistance at the junction increases to n % of the equivalent impedance of the IGBT module under test.

Preferably, the relational expression obtaining module is configured to select a non-aging IGBT module with the same model as the IGBT under test, change the temperature at the position where the IGBT module is located, apply the operating current, and measure the voltage between the collector and emitter of the IGBT module, thereby obtaining the chip conduction voltage drop $U_{ces}$ of the IGBT module under the corresponding condition, and record the data as well as illustrate a three-dimensional diagram of chip conduction voltage drop $U_{ces}$ of IGBT module—operating current $I_c$-chip junction temperature $T_c$, and utilize the curve fitting method to obtain the function $U_{ces}=f(I_c, T_c)$ of $U_{ces}$ with respect to $I_c$ and $I_c$.

Preferably, the chip conduction voltage drop obtaining module is configured to, for the IGBT module under test, obtain the chip junction temperature $T_c$ of the IGBT module under test when the IGBT module is a working state, and obtain the operating current $I_c$ flowing through the IGBT module under test as well, and calculate and obtain the chip conduction voltage $U_{ces-c}$ of the IGBT module under test in the working process based on the function of $U_{ces}$ with respect to $I_c$ and $T_c$.

Preferably, the resistance obtaining module is configured to obtain the external conduction voltage drop $U_{ces-m}$ of the IGBT module under test, along with the chip conduction voltage drop $U_{ces-c}$ of the IGBT module under test obtained through calculation, and obtain the resistance $R_w$ at the junction of the chip and the bonding wire through the formula $U_{ces-m}=U_{ces-c}+I_cR_w$.

According to another aspect of the disclosure, a computer-readable storage medium on which a computer program is stored is provided, and the computer program implements the steps of any one of the above methods when being executed by a processor.

In general, compared with related art, the above technical solutions conceived by the disclosure can achieve the following advantageous effects.

(1) Compared with conventional IGBT reliability evaluation, the two failure modes of solder layer aging and bonding wire's falling off are separated, and the bonding wire's falling off is measured, recorded and evaluated separately, thus achieving a higher accuracy.

(2) This method does not take into consideration the influence of chip temperature on aging, so the method can be used in different environments with different temperatures, thereby rendering versatility in IGBT reliability evaluation.

DESCRIPTION OF THE EMBODIMENTS

In order to make the objectives, technical solutions and advantages of the present disclosure clearer, the following further describes the present disclosure in detail with reference to the accompanying drawings and embodiments. It should be understood that the specific embodiments described here are only used to explain the present disclosure, but not to limit the present disclosure. In addition, the technical features involved in the various embodiments of the present disclosure described below can be combined with each other as long as they do not conflict with each other.

Embodiment 1

Figure 1:
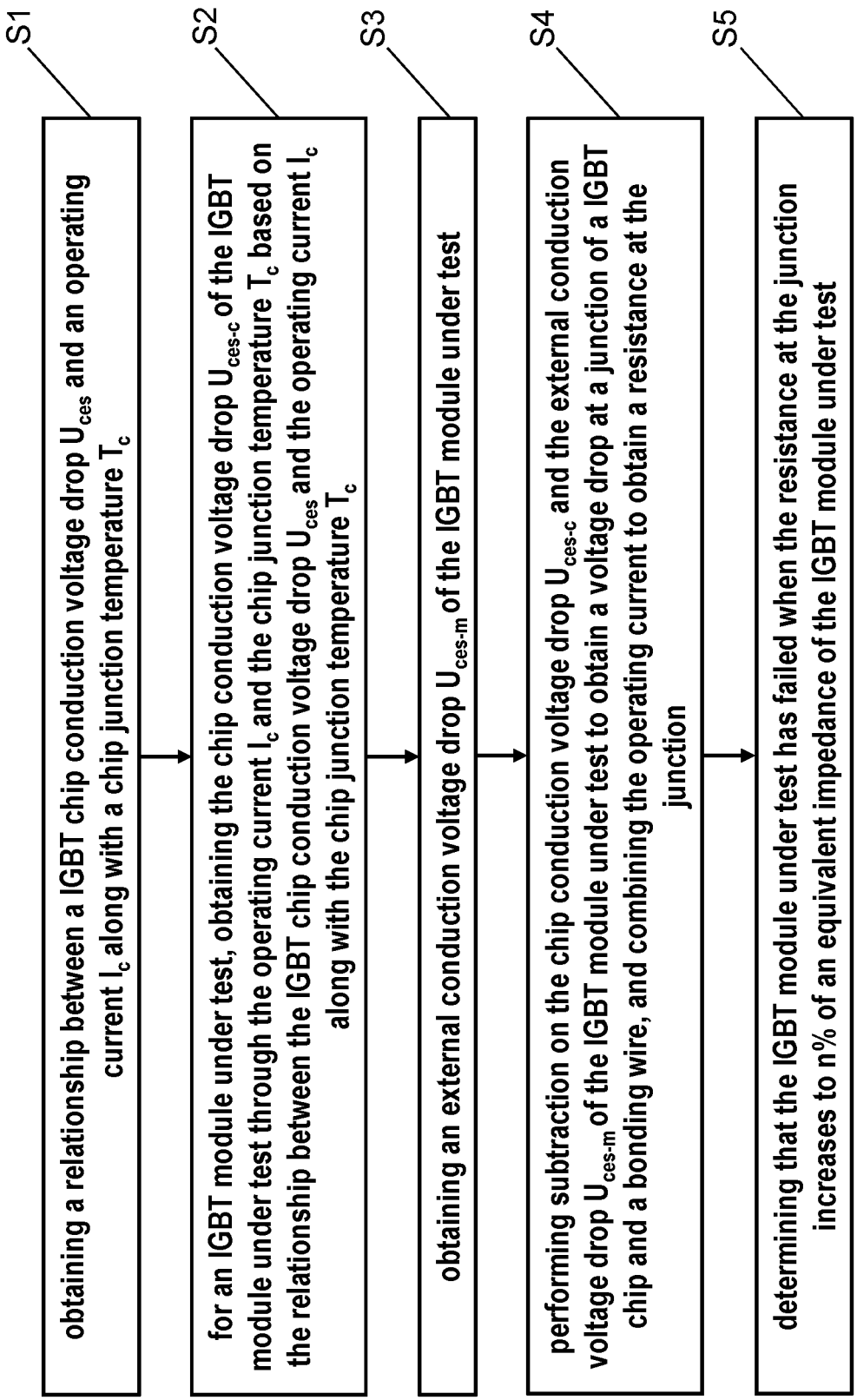
FIG. 1 is a schematic flowchart of an IGBT module reliability evaluation method based on bonding wire degradation according to an embodiment of the disclosure.

As shown in FIG. 1, FIG. 1 is a schematic flowchart of an Insulate-Gate Bipolar Transistor (IGBT) module reliability evaluation method based on bonding wire degradation according to an embodiment of the disclosure. The method shown in FIG. 1 includes the following steps.

S1: The relationship between IGBT chip conduction voltage drop $U_{ces}$ and the operating current $I_e$ along with chip junction temperature $T_c$ is obtained.

Figure 2:
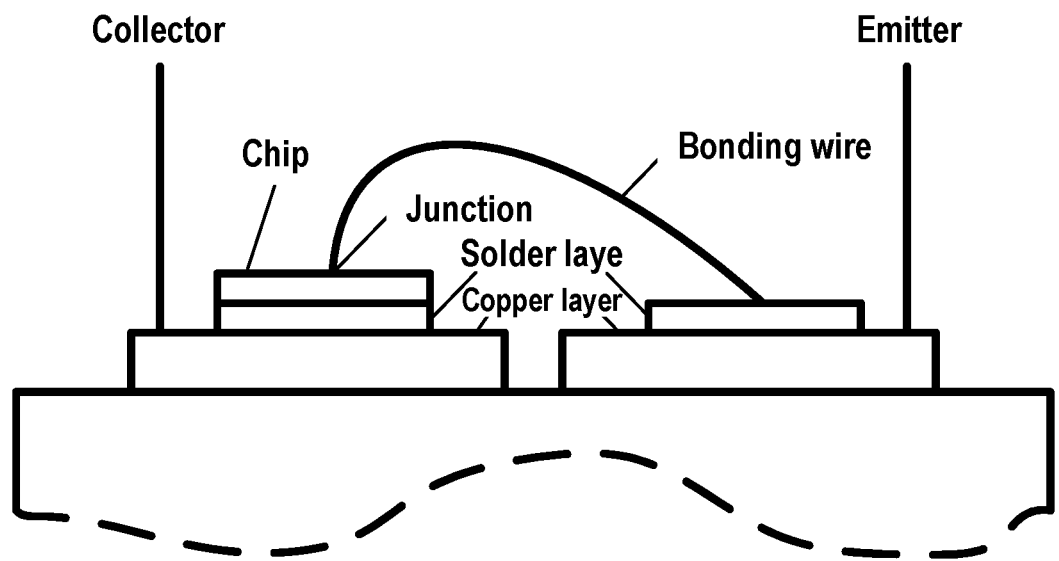
FIG. 2 is an internal structure diagram of an IGBT module according to an embodiment of the disclosure.

Specifically, FIG. 2 shows the internal structure of the IGBT module. The current enters the module from the collector, flows through copper layer-solder layer-chip-bonding wire-solder layer-copper layer in sequence, and finally reaches the emitter. The chip conduction voltage drop exhibited by the IGBT module is the sum of the chip conduction voltage drop of all parts of the entire module. Among them, the chip conduction voltage drop of the IGBT chip itself accounts for the majority of chip conduction voltage drop, but when the IGBT is about to fail, the chip conduction voltage drop of the bonding wire cannot be ignored.

Figure 3:
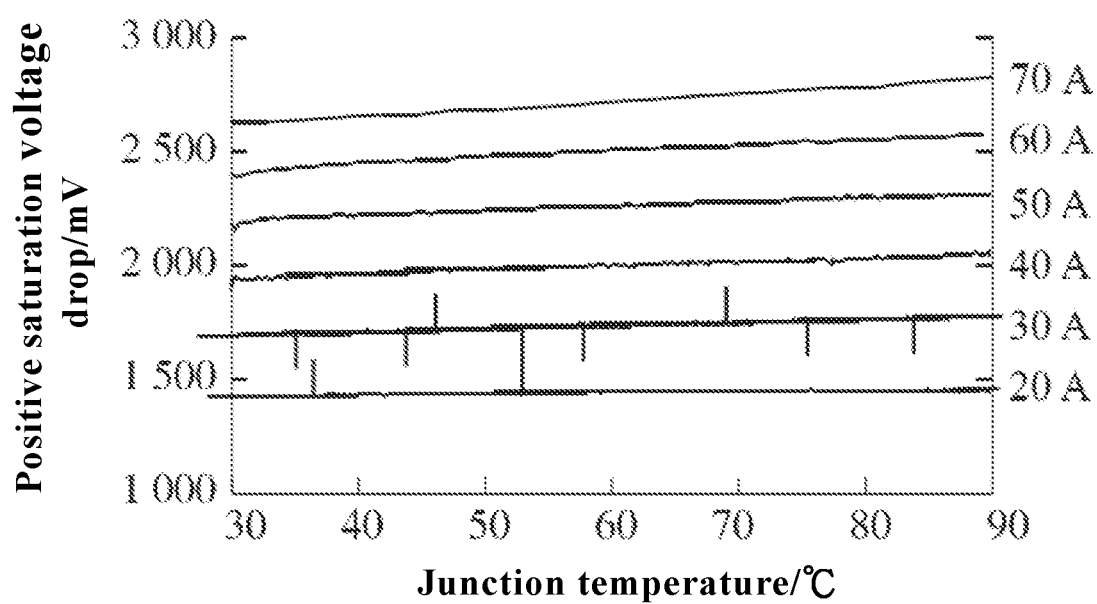
FIG. 3 is a diagram showing the relationship of chip conduction voltage drop-operating current-chip junction temperature according to an embodiment of the disclosure.

Specifically, the relationship between chip conduction voltage drop-operating current-chip junction temperature is shown in FIG. 3. There is a good linear relationship between chip conduction voltage drop and junction temperature under different operating current conditions, and the slope is associated with the operating current. As the operating current increases, the slope gradually changes from negative to positive and continues to increase.

In a preferred embodiment, step S1 can be implemented in the following manner.

S1.1: A non-aging IGBT module with the same model as the IGBT under test is selected, the temperature at the position where the IGBT module is located is changed, the operating current is applied, and the voltage between the collector and emitter of the IGBT module is measured, thereby obtaining the chip conduction voltage drop $U_{ces}$ of the IGBT module under the corresponding condition.

Specifically, the temperature at the position where the IGBT module is located can be changed through the thermostat.

Specifically, the applied operating current lasts for a short time. Because the IGBT has a short working time, it can be considered that the chip generates less heat and the chip junction temperature can be regarded as constant.

Specifically, the chip conduction voltage drop $U_{ces}$ of the IGBT module under corresponding conditions can be measured through the voltmeter connected between the collector terminal and the emitter terminal of the IGBT module. Under the circumstances, since the IGBT module is not aged, the resistance at the junction of the chip and the bonding wire can be ignored, and the measured chip conduction voltage drop under the condition is the conduction voltage drop $U_{ces-c}$ of the chip.

S1.2: The data is recorded, a three-dimensional diagram of chip conduction voltage drop $U_{ce}$ of IGBT module$_s$-operating current $I_c$-chip junction temperature $T_c$ is illustrated, and the curve fitting method is adopted to obtain the function $U_{ces}=f(I_c, T_e)$ of $U_{ces}$ with respect to $I_c$ and $T_c$.

S2: For the IGBT module under test, the chip conduction voltage drop $U_{ces-c}$ of the IGBT module under test is obtained through the operating current $I_c$ and the chip junction temperature $T_c$ based on the relationship between the IGBT chip conduction voltage drop $U_{ces}$ and the operating current $I_c$ along with the chip junction temperature $T_c$.

In a preferred embodiment, step S2 can be implemented in the following manner.

S2.1: For the IGBT module under test, the chip junction temperature $T_c$ of the IGBT module under test is obtained when the IGBT module is a working state, and the operating current $I_c$ flowing through the IGBT module under test is obtained as well.

Specifically, an infrared sensor can be utilized to measure the chip junction temperature $T_c$ of the IGBT module under test.

Figure 4:
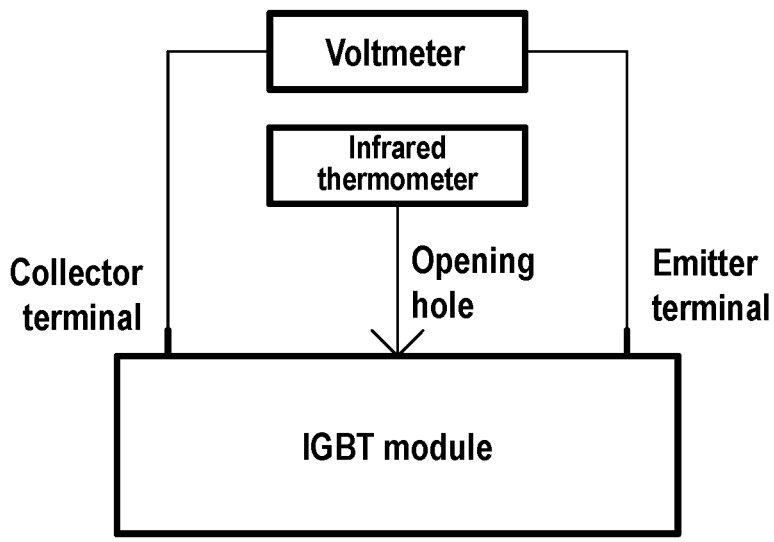
FIG. 4 is a schematic diagram of measuring an IGBT module under test according to an embodiment of the disclosure.

Specifically, as shown in FIG. 4, a hole is opened above the IGBT chip of the IGBT module, and the junction temperature of the IGBT chip is monitored by an infrared sensor to obtain the chip junction temperature $T_c$.

Specifically, an ammeter can be utilized to measure the operating current $I_c$ flowing through the IGBT module under test.

S2.2: Based on the function of $U_{ces}$ with respect to $I_e$ and $T_c$, the chip conduction voltage $U_{ces-c}$ of the IGBT module under test in the working process is obtained through calculation.

S3: The external conduction voltage drop $U_{ces-m}$ of the IGBT module under test is obtained.

Specifically, a voltmeter can be utilized to measure the external conduction voltage drop $U_{ces-m}$ of the IGBT module under test.

Specifically, as shown in FIG. 4, a voltmeter is connected between the collector and the emitter of the IGBT module to monitor the external conduction voltage drop of the IGBT module to obtain the chip conduction voltage drop $U_{ces-m}$.

S4: Subtraction is performed on the chip conduction voltage drop $U_{ces-c}$ and the external conduction voltage drop $U_{ces-m}$ of the IGBT module under test to obtain the voltage drop at the junction of the IGBT chip and the bonding wire, and the operating current is combined to obtain resistance at the junction.

In a preferred embodiment, step S4 can be implemented in the following manner.

The external conduction voltage drop $U_{ces-m}$ of the IGBT module under test is obtained, along with the chip conduction voltage drop $U_{ces-c}$ of the IGBT module under test obtained through calculation, the resistance $R_w$ at the junction of the chip and the bonding wire is obtained through the formula $U_{ces-m}=U_{ces-c}+I_cR_w$.

Specifically, the external conduction voltage drop $U_{ces-m}$ of the IGBT module measured by the voltmeter, along with the chip conduction voltage drop $U_{ces-c}$ of the IGBT chip obtained through calculation, the formula $U_{ces-m}=U_{ces-c}+I_cR_w+R_0$ can be utilized to calculate and obtain the resistance $R_w$ at the junction of the chip and the bonding wire. Specifically, $R_0$ is the sum of the resistance of the other materials except the resistance at the junction of the chip and the bonding wire in the module, wherein the other materials include solder layer, copper layer and bonding wire, which can be ignored. Therefore, the formula for calculating the resistance at the junction of the chip and the bonding wire is $R_w=(U_{ces-m}-U_{ces-c})/I_c$.

S5: When the resistance at the junction increases to n % of the equivalent impedance of the IGBT module under test, it is determined that the IGBT module under test has failed.

In a preferred embodiment, step S5 can be implemented in the following manner.

When the resistance at the junction increases to 5% of the equivalent impedance of the IGBT module under test, it is determined that the IGBT module under test has failed.

Specifically, the specific method for determining IGBT failure is as follows.

It is generally believed that when the IGBT chip conduction voltage drop increment reaches 5%, it can be determined that the IGBT has failed. Based on the formula $U_{ces-m}=U_{ces-c}+I_cR_w+R_0$, when $U_{ces-m}$ rises by 5%, $R_0$ is ignored, and the equations can be obtained:

$$\begin{cases} U_{ces-m} = U_{ces-c} + I_cR_w \\ 1.05U_{ces-m} = U'_{ces-c} + I_cR'_w \end{cases}$$

After subtraction is performed, the following can be obtained.

$$R'_w - R_w = \frac{0.05U_{ces-m} - (U'_{ces-c} - U_{ces-c})}{I_c}$$

Due to the aging of the solder layer, when the chip conduction voltage drop of the module increases by 5%, the resistance at the junction of the bonding wire will be slightly less than 0.05 times the equivalent impedance of the IGBT. The equivalent impedance is typically 10 mΩ, to 100 mΩ, so based on the overall criterion it can be determined that the IGBT has failed when the resistance at the junction of the IGBT chip and the bonding wire increases to 5% of the equivalent impedance of the IGBT.

Embodiment 2

Figure 5:
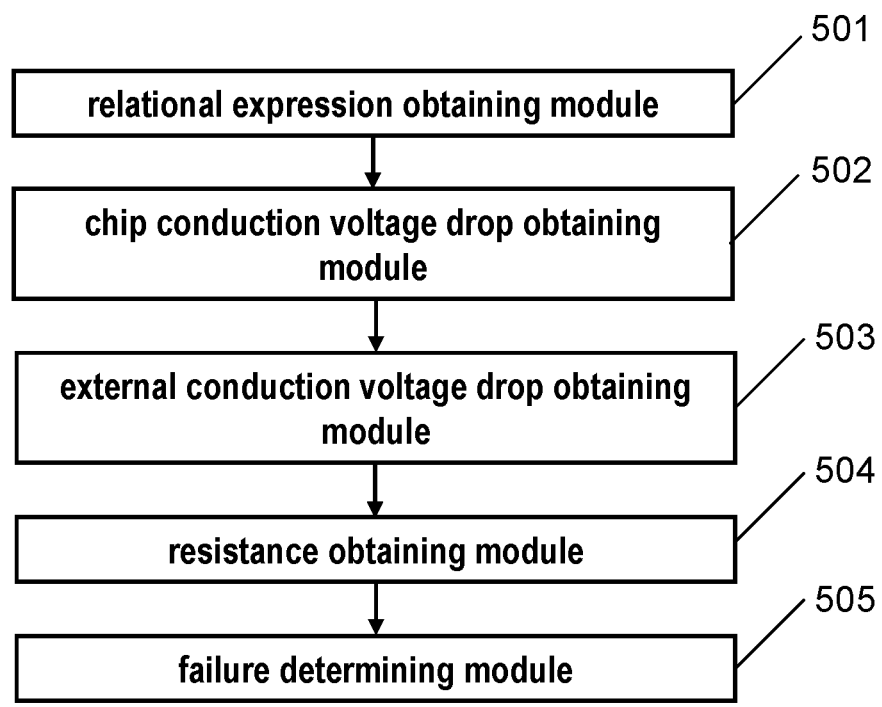
FIG. 5 is a schematic structural diagram of an IGBT module reliability evaluation device based on bonding wire degradation according to an embodiment of the disclosure.

FIG. 5 is a schematic structural diagram of an IGBT module reliability evaluation device based on bonding wire degradation according to an embodiment of the disclosure, and the device includes the following.

A relational expression obtaining module 501 is configured to obtain the relationship between the IGBT chip conduction voltage drop $U_{ces}$ and the operating current $I_c$ along with the chip junction temperature $T_c$.

In a preferred embodiment, the relational expression obtaining module 501 is configured to select a non-aging IGBT module with the same model as the IGBT under test, change the temperature at the position where the IGBT module is located, apply the operating current, and measure the voltage between the collector and emitter of the IGBT module, thereby obtaining the chip conduction voltage drop $U_{ces}$ of the IGBT module under the corresponding condition, and record the data as well as illustrate a three-dimensional diagram of chip conduction voltage drop $U_{ces}$ of IGBT module—operating current $I_c$-chip junction temperature $T_c$, and utilize the curve fitting method to obtain the function $U_{ces}=f(I_c, T_c)$ of $U_{ces}$ with respect to $I_c$ and $T_c$.

A chip conduction voltage drop obtaining module 502 is configured to, for the IGBT module under test, obtain the chip conduction voltage drop $U_{ces-c}$ of the IGBT module under test through the operating current $I_c$ and the chip junction temperature $T_c$ based on the relationship between the IGBT chip conduction voltage drop $U_{ces}$ and the operating current $I_c$ along with the chip junction temperature $T_c$.

In a preferred embodiment, the chip conduction voltage drop obtaining module 502 is configured to, for the IGBT module under test, obtain the chip junction temperature $T_c$ of the IGBT module under test when the IGBT module is a working state, and obtain the operating current $I_c$ flowing through the IGBT module under test as well, and calculate and obtain the chip conduction voltage $U_{ces-c}$ of the IGBT module under test in the working process based on the function of $U_{ces}$ with respect to $I_c$ and $T_c$.

An external conduction voltage drop obtaining module 503 is configured to obtain the external conduction voltage drop $U_{ces-m}$ of the IGBT module under test.

A resistance obtaining module 504 is configured to perform subtraction on the chip conduction voltage drop $U_{ces-c}$ and the external conduction voltage drop $U_{ces-m}$ of the IGBT module under test to obtain the voltage drop at the junction of the IGBT chip and the bonding wire, and the operating current is combined to obtain resistance at the junction.

In a preferred embodiment, the resistance obtaining module 504 is configured to obtain the external conduction voltage drop $U_{ces-m}$ of the IGBT module under test, along with the chip conduction voltage drop $U_{ces-c}$ of the IGBT module under test obtained through calculation, and obtain the resistance $R_w$ at the junction of the chip and the bonding wire through the formula $U_{ces-m}=U_{ces-c}+I_cR_w$.

A failure determining module 505 is configured to determine that the IGBT module under test has failed when the resistance at the junction increases to n % of the equivalent impedance of the IGBT module under test.

In a preferred embodiment, when the resistance at the junction increases to 5% of the equivalent impedance of the IGBT module under test, it is determined that the IGBT module under test has failed.

In the embodiment of the disclosure, the specific implementation of each module can be found in the description of the method embodiment, and further descriptions will not be narrated herein.

Embodiment 3

The disclosure also provides a computer-readable storage medium, such as flash memory, hard disk, multimedia card, card type memory (for example, SD or DX memory, etc.), random access memory (RAM), static random access memory SRAM, read-only memory (ROM), electrically erasable programmable read-only memory (EEPROM), programmable read-only memory (PROM), magnetic memory, floppy disk, optical disc, server, App application mall, etc., on which a computer program is stored, and the computer program implements the IGBT module reliability evaluation method described in the method embodiment based on bonding wire degradation.

It should be pointed out that according to the needs of implementation, each step/component described in this disclosure can be split into more steps/components, or two or more steps/components or partial operations of steps/components can be combined into new ones to achieve the purpose of the disclosure.

Those skilled in the art can easily understand that the above descriptions are only preferred embodiments of the present disclosure and are not intended to limit the present disclosure. Any modification, equivalent replacement and improvement, etc. made within the spirit and principle of the present disclosure should fall within the protection scope of the present disclosure.

What is claimed is:
1. An Insulate-Gate Bipolar Transistor (IGBT) module reliability evaluation method based on bonding wire degradation, wherein the method comprises the following steps:
   (1) obtaining a relationship between a IGBT chip conduction voltage drop $U_{ces}$ and an operating current $I_c$ along with a chip junction temperature $T_c$;
   (2) for an IGBT module under test, obtaining the chip conduction voltage drop $U_{ces-c}$ of the IGBT module under test through the operating current $I_c$ and the chip junction temperature $T_c$ based on the relationship between the IGBT chip conduction voltage drop $U_{ces}$ and the operating current $I_c$ along with the chip junction temperature $T_c$;
   (3) obtaining an external conduction voltage drop $U_{ces-m}$ of the IGBT module under test;
   (4) performing subtraction on the chip conduction voltage drop $U_{ces-c}$ and the external conduction voltage drop $U_{ces-m}$ of the IGBT module under test to obtain a voltage drop at a junction of a IGBT chip and a bonding wire, and combining the operating current to obtain a resistance at the junction;
   (5) determining that the IGBT module under test has failed when the resistance at the junction increases to n % of an equivalent impedance of the IGBT module under test.

2. The method according to claim 1, wherein step (1) comprises:

(1.1) selecting a non-aging IGBT module with the same model as the IGBT under test, changing a temperature at a position where the IGBT module is located, applying the operating current, and measuring a voltage between a collector and an emitter of the IGBT module, thereby obtaining the chip conduction voltage drop $U_{ces}$ of the IGBT module under corresponding conditions;

(1.2) recording data, and illustrating a three-dimensional diagram of the chip conduction voltage drop $U_{ces}$ of the IGBT module—the operating current $I_c$—the chip junction temperature $T_c$, and utilizing a curve fitting method to obtain a function $U_{ces}=f(I_c, T_c)$ of $U_{ces}$ with respect to $I_c$ and $T_c$.

3. The method according to claim 2, wherein step (2) comprises:

(2.1) for the IGBT module under test, obtaining the chip junction temperature $T_c$ of the IGBT module under test when the IGBT module is a working state, and obtaining the operating current $I_c$ flowing through the IGBT module under test;

(2.2) based on the function of $U_{ces}$ with respect to $I_c$ and $T_c$, performing calculation to obtain the chip conduction voltage $U_{ces-c}$ of the IGBT module under test in the working process.

4. The method according to claim 1, wherein step (4) comprises:

obtaining the external conduction voltage drop $U_{ces-m}$ of the IGBT module under test, along with the chip conduction voltage drop $U_{ces-c}$ of the IGBT module under test obtained through calculation, obtaining the resistance $R_w$ at the junction of the chip and the bonding wire through a formula $U_{ces-m}=U_{ces-c}+I_c R_w$.

5. The method according to claim 2, wherein step (4) comprises:

obtaining the external conduction voltage drop $U_{ces-m}$ of the IGBT module under test, along with the chip conduction voltage drop $U_{ces-c}$ of the IGBT module under test obtained through calculation, obtaining the resistance $R_w$ at the junction of the chip and the bonding wire through a formula $U_{ces-m}=U_{ces-c}+I_c R_w$.

6. The method according to claim 3, wherein step (4) comprises:

obtaining the external conduction voltage drop $U_{ces-m}$ of the IGBT module under test, along with the chip conduction voltage drop $U_{ces-c}$ of the IGBT module under test obtained through calculation, obtaining the resistance $R_w$ at the junction of the chip and the bonding wire through a formula $U_{ces-m}=U_{ces-c}+I_c R_w$.

7. The method according to claim 4, wherein step (5) comprises:

determining that the IGBT module under test has failed when the resistance at the junction increases to 5% of the equivalent impedance of the IGBT module under test.

8. The method according to claim 5, wherein step (5) comprises:

determining that the IGBT module under test has failed when the resistance at the junction increases to 5% of the equivalent impedance of the IGBT module under test.

9. The method according to claim 6, wherein step (5) comprises:

determining that the IGBT module under test has failed when the resistance at the junction increases to 5% of the equivalent impedance of the IGBT module under test.

10. An IGBT module reliability evaluation device based on bonding wire degradation, wherein the device comprises:

a relational expression obtaining module configured to obtain a relationship between a IGBT chip conduction voltage drop $U_{ces}$ and an operating current $I_c$ along with a chip junction temperature $T_c$;

a chip conduction voltage drop obtaining module configured to, for the IGBT module under test, obtain the chip conduction voltage drop $U_{ces-c}$ of the IGBT module under test through the operating current $I_c$ and the chip junction temperature $T_c$ based on the relationship between the IGBT chip conduction voltage drop $U_{ces}$ and the operating current $I_c$ along with the chip junction temperature $T_c$;

an external conduction voltage drop obtaining module configured to obtain an external conduction voltage drop $U_{ces-m}$ of the IGBT module under test;

a resistance obtaining module configured to perform subtraction on the chip conduction voltage drop $U_{ces-c}$ and the external conduction voltage drop $U_{ces-m}$ of the IGBT module under test to obtain a voltage drop at a junction of a IGBT chip and a bonding wire, and combine the operating current to obtain a resistance at the junction;

a failure determining module configured to determine that the IGBT module under test has failed when the resistance at the junction increases to n % of an equivalent impedance of the IGBT module under test.

11. The device according to claim 10, wherein the relational expression obtaining module is configured to select a non-aging IGBT module with the same model as the IGBT under test, change a temperature at a position where the IGBT module is located, apply the operating current, and measure a voltage between a collector and an emitter of the IGBT module, thereby obtaining the chip conduction voltage drop $U_{ces}$ of the IGBT module under corresponding conditions, and record the data as well as illustrate a three-dimensional diagram of the chip conduction voltage drop $U_{ces}$ of the IGBT module—the operating current $I_c$—the chip junction temperature $T_c$, and utilize a curve fitting method to obtain a function $U_{ces}=f(I_c, T_c)$ of $U_{ces}$ with respect to $I_c$ and $T_c$.

12. The device according to claim 11, wherein the chip conduction voltage drop obtaining module is configured to, for the IGBT module under test, obtain the chip junction temperature $T_c$ of the IGBT module under test when the IGBT module is a working state, and obtain the operating current $I_c$ flowing through the IGBT module under test, and calculate and obtain the chip conduction voltage $U_{ces}$ of the IGBT module under test in a working process based on the function of $U_{ces}$ with respect to $I_c$ and $T_c$.

13. The device according to any one of claim 10, wherein the resistance obtaining module is configured to obtain the external conduction voltage drop $U_{ces-m}$ of the IGBT module under test, along with the chip conduction voltage drop $U_{ces-c}$ of the IGBT module under test obtained through calculation, and obtain the resistance $R_w$ at the junction of the chip and the bonding wire through a formula $U_{ces-m}=U_{ces-c}+I_c R_w$.

14. The device according to any one of claim 11, wherein the resistance obtaining module is configured to obtain the external conduction voltage drop $U_{ces-m}$ of the IGBT module under test, along with the chip conduction voltage drop $U_{ces}$, of the IGBT module under test obtained through calculation, and obtain the resistance $R_w$ at the junction of the chip and the bonding wire through a formula $U_{ces-m}=U_{ces-c}+I_c R_w$.

15. The device according to any one of claim 12, wherein the resistance obtaining module is configured to obtain the external conduction voltage drop $U_{ces-m}$ of the IGBT module under test, along with the chip conduction voltage drop $U_{ces-c}$ of the IGBT module under test obtained through calculation, and obtain the resistance $R_w$ at the junction of the chip and the bonding wire through a formula $U_{ces-m}=U_{ces-c}+I_c R_w$.

16. A non-transitory computer-readable storage medium, on which a computer program is stored, wherein the computer program implements the steps of the method claimed in claim 1 when being executed by a processor.

17. A non-transitory computer-readable storage medium, on which a computer program is stored, wherein the computer program implements the steps of the method claimed in claim 2 when being executed by a processor.

18. A non-transitory computer-readable storage medium, on which a computer program is stored, wherein the computer program implements the steps of the method claimed in claim 3 when being executed by a processor.

19. A non-transitory computer-readable storage medium, on which a computer program is stored, wherein the computer program implements the steps of the method claimed in claim 4 when being executed by a processor.

20. A non-transitory computer-readable storage medium, on which a computer program is stored, wherein the computer program implements the steps of the method claimed in claim 7 when being executed by a processor.

* * * * *